United States Patent [19]
McLaury

[11] Patent Number: 5,394,172
[45] Date of Patent: Feb. 28, 1995

[54] VRAM HAVING ISOLATED ARRAY SECTIONS FOR PROVIDING WRITE FUNCTIONS THAT WILL NOT AFFECT OTHER ARRAY SECTIONS

[75] Inventor: Loren L. McLaury, Boise, Id.

[73] Assignee: Micron Semiconductor, Inc., Boise, Id.

[21] Appl. No.: 29,816

[22] Filed: Mar. 11, 1993

[51] Int. Cl.$^6$ ............................................. G09G 5/36
[52] U.S. Cl. ..................................... 345/200; 345/201; 365/230.05
[58] Field of Search ............... 345/189, 197, 200, 201, 345/193; 365/230.01–230.09, 220, 221

[56] References Cited

U.S. PATENT DOCUMENTS

| | | | |
|---|---|---|---|
| 4,656,596 | 4/1987 | Thaden et al. | 364/521 |
| 4,727,363 | 2/1988 | Ishii | 340/724 |
| 4,737,780 | 4/1988 | Ishii | 340/750 |
| 4,884,069 | 11/1989 | Farand | 340/799 |
| 4,897,818 | 1/1990 | Rodwine et al. | 365/221 |
| 4,941,127 | 7/1990 | Hashimoto | 365/189.01 |
| 4,984,214 | 1/1991 | Hiltebeital et al. | 365/230.05 |
| 5,001,672 | 3/1991 | Ebbera et al. | 365/230.05 |
| 5,065,368 | 11/1991 | Gupta et al. | 365/230.05 |
| 5,065,369 | 11/1991 | Toda | 365/230.05 |
| 5,121,360 | 6/1992 | West | 365/730.03 |
| 5,142,276 | 8/1992 | Moffat | 340/799 |

OTHER PUBLICATIONS

DRAM Data Book, by Micron Technology, Inc. 1992 Chapter 5–Multiport DRAM.

*Primary Examiner*—Ulysses Weldon
*Assistant Examiner*—Gin Goon
*Attorney, Agent, or Firm*—Susan B. Collier

[57] ABSTRACT

A video RAM having isolated array sections for providing write function that will not affect other array sections. The whole VRAM memory array does not have to be completely read before writing new pixel information to particular array section. At least two separate VRAM activities can be performed simultaneously to different parts of the array. Specifically, to write to one particular section of an array and to and for refreshing other parts of the VRAM. The overall read and write sequences can be shorter. When a particular pixel or memory cell has to be modified or update, only an associated SAM to the particular cell will be activated. This SAM will now only affect the column lines associated with that section of the array containing the activated SAM.

7 Claims, 4 Drawing Sheets

VRAM HAVING ISOLATED ARRAY SECTIONS FOR PROVIDING WRITE FUNCTIONS THAT WILL NOT AFFECT OTHER ARRAY SECTIONS

FIELD OF THE INVENTION

The present invention relates to integrated circuits (ICs). Particularly, there is a video random access memory, or VRAM. Uniquely, the Video RAM has a more completely isolated array halves circuitry.

BACKGROUND OF THE INVENTION

Historically

In video systems, the information displayed is segmented into discrete elements referred to as "pixels", the number of pixels per unit area determines the available resolution. Each of these pixels, for a simple black and white system, can be defined in terms of one bit of data; whereas, a more complex system utilizing pixels having differing colors and intensity levels requires significantly more bits of data. To display the pixel information stored in memory, data is read from memory and then organized in an interim storage medium having a serial format. As each horizontal line in the display is scanned, the pixel data is serially output and converted to video information. For example, the stored data for each black and white pixel correspond to a predetermined position in the scan line and determines the video output for either "white" level or a "black" level.

Two of the primary features of a pixel memory storage unit, referred to as a Video Random Access Memory or VRAM for short, are the number of pixels required per scan line and the scanning rate. This determines how the pixel information is mapped into the memory and the rate at which the stored pixel information must be accessed and serially output. Typically, video memories are "pixel mapped" such that one row of memory elements or portion thereof directly corresponds to the pixel information of a given scan line or portion thereof. For example, in a black and white system having 256 pixels per scan line, a memory having 256 memory elements per row would be utilized. The information in the row is accessed and stored in a serial shift register for serial output therefrom during a given scan line, thereby requiring only one memory access per scan line. While data is being output from the serial shift register to the display, data is being accessed from the memory for updating of display data. This data is transferred to the shift register during the retrace period between adjacent scan lines. Therefore, the number of rows and columns of memory elements is determined by the number bits of information per pixel and the number of scan lines in the display.

In applications utilizing pixel mapped video memories, a large number of individual memories are arranged in arrays such that a single access operation outputs a predetermined pixel pattern. This allows a large number of pixels and/or bits per pixel to be output during a single access time, thereby reducing the time required to access a given set of information. This array configuration may require the shift registers associated with individual memories to be either cascaded or arranged in parallel.

To facilitate the use of multiple pixel mapped video memories, it is desirable to incorporate more than one memory on a single semiconductor chip. To provide a viable device from both an economical and a marketing standpoint, each of the integrated memories must maintain some degree of independent operation relative to the other memories on the same chip and yet share as many control functions as possible. This is necessary to reduce the number of integrated circuit pins required to interface between the peripheral circuitry and the chip itself, and also to reduce the circuit density. When multiple pixel mapped video memories are integrated onto a single semiconductor chip, it is desirable to have independent access to the serial inputs and outputs of each of the memories. Additionally, it is desired to have independent control of the random read/write control functions. However, if both independent access and control are integrated together, the architecture would result in an impractical multi-pin package. Additionally, the control circuitry required to provide the various independent functions would increase the density of the chip circuitry. Therefore, there is a need for independent access and control circuitry that utilizes a small portion of the chip.

FIG. 1 is a suitable representative illustration of the applicants overall functional block diagram teaching how a typical VRAM may work, and can be arranged. A VRAM often includes the following elements: The VRAM 10 has inputs and I/O lines and several inputs associated with a timing generator and control logic 84. The VRAMs pixel or bit memory is contained in a DRAM array 12, having four arrays each represented by 12x1, 12x2, 12x3, and 12x4. For the remainder of the description of FIG. 1, the drawing will not show the multiple circuits needed for arrays 12x2, 12x3 and 12x4. Each array is associated with a sense amplifier 15x1 through 15x4, and a single column decoder 14 which in turn is coupled to a column address latch/buffer 17. Additionally, the arrays 12 are responsive to transfer gates 16. There are two banks of transfer gates associated with each array, having the following numbering arrangement: 16x1a and 16x1b (indicating the first array on the left "a" and on the right "b"), 16x2a and 16x2b and so forth. It is noted that the text will use lower case lettering, while the figures use upper case lettering for the elements. Each left bank of transfer gates is associated with a lower SAM (sometimes known as a serial access memory, or a static addressable memory) 18x1a, 18x2a etc. Similarly, each right sided transfer gate bank is coupled to an upper SAM 18x1b, 18x2b, etc. All of the SAMs are directed by a SAM location decoder 20. Decoder 20 is coupled to a SAM output and input buffers 64 for a VRAM I/O, and coupled to a SAM address counter 56. Counter 56 is coupled to a SAM address latch/buffer 58 where both are associated with a split SAM status and control circuit 60, and a pass control logic circuit 62. One way the DRAM memory 12 is coupled to outside inputs is via row address latch/buffer 50 and row decoder 52. Refresh counter 54 is coupled to row address latch/buffer 50. Column latch 17 is coupled to a column mask circuit 66. DRAM input buffers 68 is coupled to the output of column mask 66. Decoder 14 is coupled to a DRAM output buffer 80 and to a MASK/write control logic circuit 74. Circuit 74 is coupled to DRAM input buffers 68 via color register 72, and mux 70. Mux 70 is also receiving signals from the column mask 66 which are also coupled to circuit 74. There is a block write control logic feeding into the register 72, mux 70 and column mask. Control logic circuit 74 also receives signals from a mask data register which is responsive to a masked write control logic 78, column mask 66 and DRAM input buffers 68.

Generally, where applicable, the figure numbering elements will be described without reference to other arrays since all arrays are similarly configured, and thus are similarly numbered.

FIG. 2 is a more detailed illustration of a related art DRAM memory array and associated circuitry, which in addition to the elements discussed in FIG. 1, further comprises the following new elements in reference to the first of the represented two memory blocks, labeled 12x1. A P-channel transistor 30 generates a PSA (P-sense amplifier) strobe signal in response to a PLAT (P latch) signal 32. The PSA strobe signal strobes the P-sense amplifier. An N-channel transistor 28 generates an NSA (N-sense amplifier) strobe signal in response to an NLAT (N latch) signal 34. The NSA strobe signal strobes the N-sense amplifier. All PSAs (P-sense amplifiers) in the array respond to the PSA (P-sense amplifier) strobe signal, and all NSAs (N-sense amplifiers) in the array respond to the NSA (N-sense amplifier) strobe signal.

Problems

One skilled in the art will understand VRAM operations. In particular, a VRAM memory stores the pixel information for the video screen. Every time a pixel needs to be updated, because the video image changes, the SAM and related circuitry will modify, or write the new information to the appropriate pixel location.

One advantage of this architecture is that pass gates 16 are connected to only one half of every array 12. The portions of the array that are to receive new signals have the pass gates activated, while the array halves not receiving new signals are masked, or not activated. This allows for the efficient inputting of pixel signals that only need to be modified. The unchanged pixels do not receive any new signals.

However, there is a major array read and write redundancy created because of this pass gate architecture. Any time a particular portion of a SAM is activated, via the pass gates 16, the SAM signals would affect the whole coupled PLAT and NLAT strobe lines 24 and 26. Line 26 would automatically latch and go low and line 24 would automatically latch and be pulled high. Thus, subsequently any pixel signals that are to be dumped onto those lines would be destroyed or overpowered by the auto latching's larger voltage swings.

Because of this known auto latching, a redundancy has been built into typical VRAM operations. Particularly, the whole VRAM memory array has had to be first read row by row before writing to the few pixels that have been changed. Thus, requiring processing all of the pixel signals along a given row of memory elements before auto latching occurs. Then the new incoming pixel signals are written to the arrays, and the unchanged pixel signals are redundantly written back to their same locations in the arrays. This redundancy results in a longer and more complex read and write processes.

It is noted that the above described problems, as well as other problems, are solved through the subject invention and will become more apparent, to one skilled in the art, from the detailed description of the subject invention.

SUMMARY OF THE INVENTION

One skilled in the art will appreciate the advantage of a Video RAM having more completely isolated array halves. A key advantage is that the whole VRAM memory array does not have to be completely read before writing new pixel information to particular array halves.

An additional advantage is that there is maintained independent control in writing to each array half via the SAM circuitry and pass gates.

A further advantage occurs when a particular pixel or memory cell has to be modify or update. Only an associated SAM to the particular cell will be activated. This SAM will now only affect the column lines associated with that half of the array containing the activated SAM. Where previously any single SAM activation would affect all column lines of the total array because of the continuous connection of the P and NLAT strobe lines 24 and 26.

Other features, advantages, and objects of the present invention will become more clear from the following detailed description of the invention, taken in conjunction with the accompanying drawings and claims, or may be learned by the practice of the invention.

Figure 1:
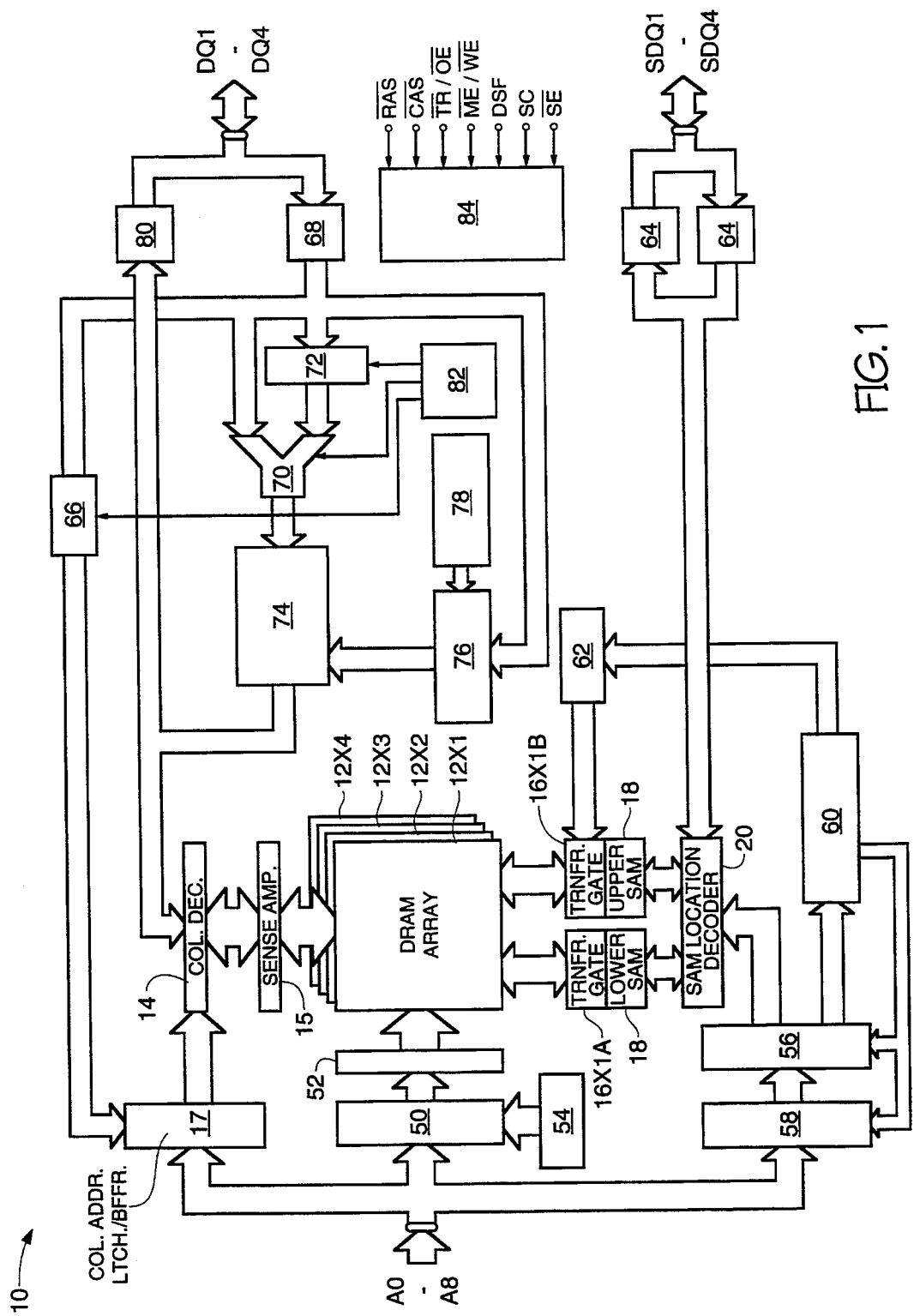
FIG. 1 is a detailed illustration of a representative functional block diagram for a VRAM architecture.

It is noted that the drawings of the invention are not to scale. The drawings are merely schematic representations, not intended to portray specific parameters of the invention. The drawings are intended to depict only typical embodiments of the invention, and are therefore not to be considered limiting of its scope. The invention will be described with additional specificity and detail through the use of the accompanying drawings. Additionally, like numbering in the drawings represent like elements within and between drawings.

DETAILED DESCRIPTION OF THE ILLUSTRATED EMBODIMENT

This disclosure of the invention is submitted in furtherance of the constitutional purposes of the U.S. Patent Laws "to promote the progress of science and useful arts" (Article 1, Section 8 of the U.S. Constitution).

Incorporated Material

The following U.S. patents are herein incorporated by reference for pertinent and supporting information:

U.S. Pat. No. 4,656,596, is a video memory controller that controls a DRAM used as a video memory and as a system memory.

U.S. Pat. No. 4,727,363, is a video RAM write control apparatus comprising a video RAM of byte access for storing dot pattern data, and a write circuit for supplying write data of one byte and a write enable signal to the video RAM.

U.S. Pat. No. 4,737,780, is a display control circuit for reading display data from a video RAM constituted by a dynamic RAM, thereby refreshing memory cells of the video RAM.

U.S. Pat. No. 4,884,069, is a video apparatus employing VRAMs for a computer which includes a CPU and main memory.

U.S. Pat. No. 4,941,127, is a method for operating semiconductor memory system in the storage and read-out of video signal data.

U.S. Pat. No. 4,897,818, is a dual-port memory with inhibited random access during transfer cycles to prevent two or more different data bits from appearing simultaneously from the RAM using and causing confusion as to which is the valid signal and which is a spurious signal.

U.S. Pat. No. 4,984,214, is a multiplexed serial register architecture for a VRAM.

U.S. Pat. No. 5,001,672, is a video RAM with external select of active serial access register which allows the external selection of the portion of the SAM to be scanned out.

U.S. Pat. No. 5,065,368, is a video RAM double buffer select control that allows for the selecting from two alternate frame buffers on a per pixel basis.

U.S. Pat. No. 5,065,369, is a video memory device that includes a RAM and a plurality of SAMs.

U.S. Pat. No. 5,121,360, is a video RAM serial port access device wherein full and efficient use of a serial access memory portion provides a simple and efficient means of avoiding mid-line reloads.

U.S. Pat. No. 5,142,276, is a method and apparatus for arranging access of VRAMs to provide accelerated writing of vertical lines to an output display.

For the purpose of providing background material which may in some respects illustrate the state of the art, the following books, articles, pamphlets, or data books are herein incorporated by reference:

*DRAM Data Book*, by Micron Technology, Inc., 1992. Particularly, chapter 5 on Multiport DRAMs (VRAMs).

General Embodiment

As previously indicated, the following discussion will generally only refer to the first memory array 12x1 and related circuitry, and not to the second 12x2, third 12x3, or fourth 12x4 arrays, since all four arrays are substantially identical.

Figure 3:
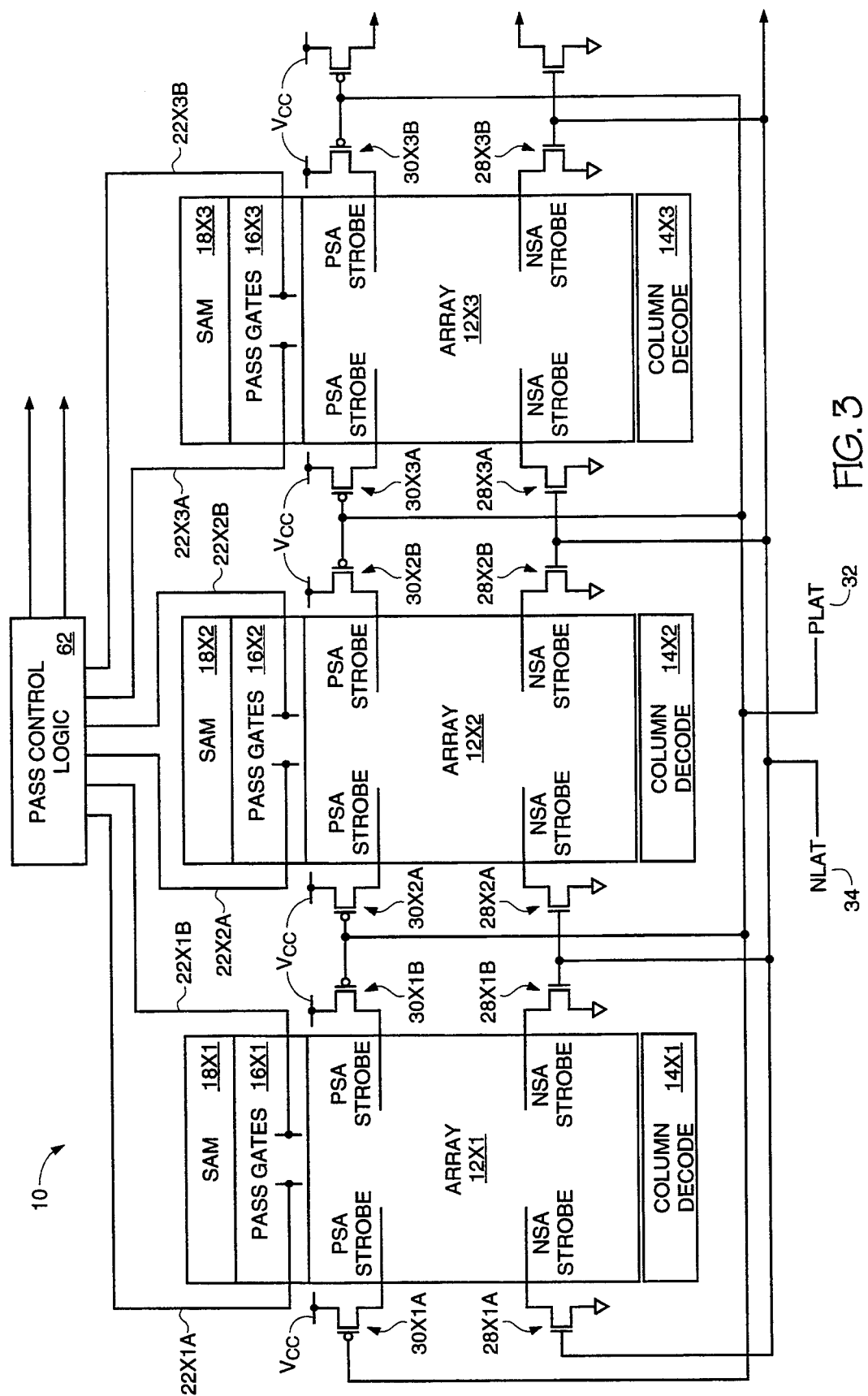
FIG. 3 is a schematic drawing of the invention.

FIG. 3 is a schematic of the VRAM 10 including the following additional elements: There is a pass control logic circuit 62, memory array 12x1, pass gates 16x1a and 16x1b, and SAM circuitry 18x1a and 18x1b for each array.

There are two main control signals: NLAT (N-channel latch) signal 34 is connected to N-channel transistors 28x1a and 28x1b. PLAT (P-channel latch) signal 32 is connected to P-channel transistors 30x1a and 30x1b.

Figure 4:
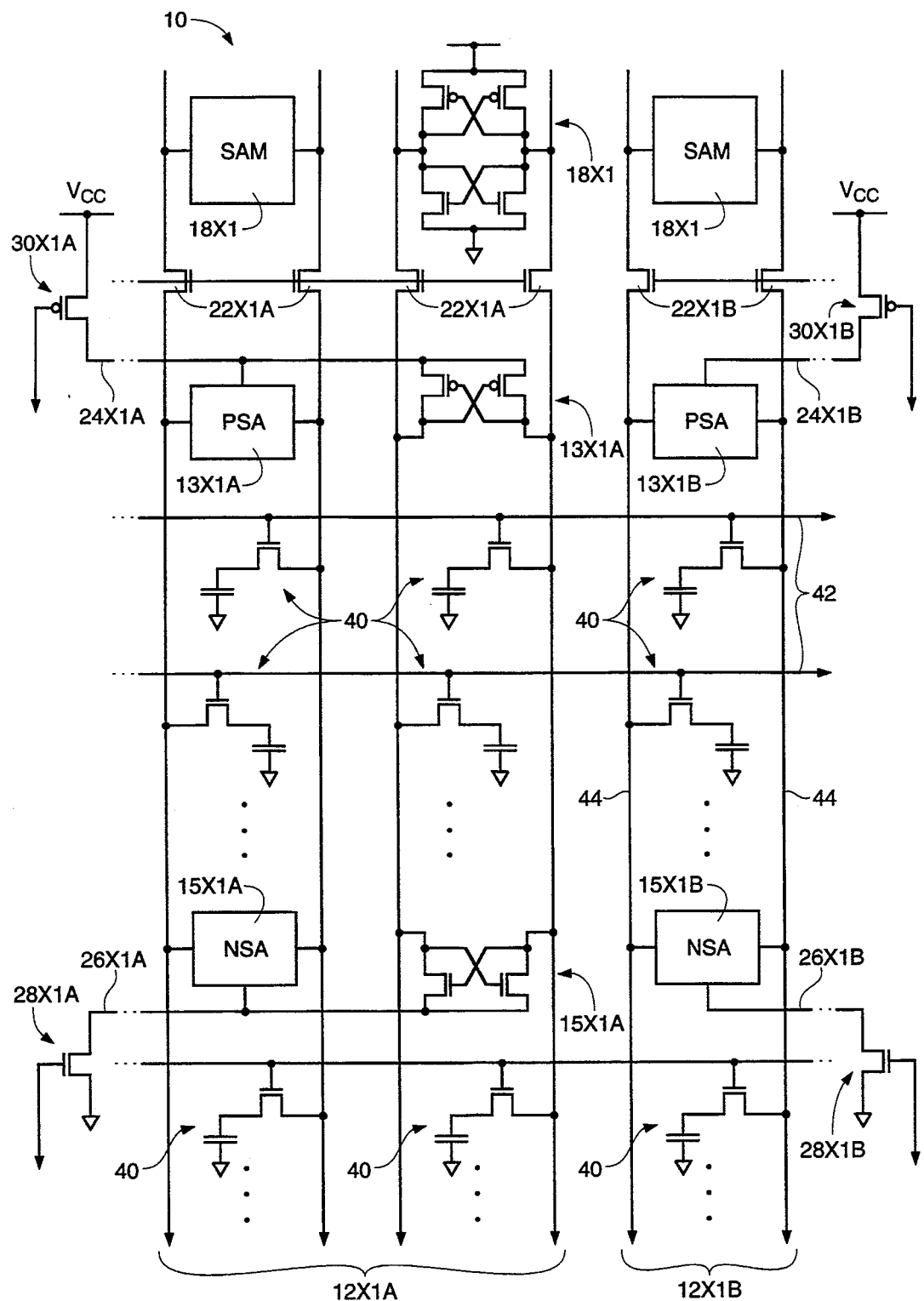
FIG. 4 is a detailed schematic drawing of one array section of the invention.

FIG. 4 is provided to illustrate the divided circuitry between the first and second halves or sections of each array. Specifically, there is illustrated array 12x1 showing two halves or sections 12x1a and 12x1b, with the addition over the prior figures the following elements: PSAs (P-sense amplifier) 13x1a and 13x1a and 13x1b and NSAs (N-sense amplifiers) 15x1a and 15x1b, memory cells 40, PLAT strobe lines 24x1a and b, and NLAT strobe lines 26x1a and b, column lines 44, and row lines 42. Additionally, one skilled in the art will recognize the more detailed SAM, PSA, and NSA circuitry. Strobe lines 24x1A and 24x1B are actually output nodes of transistors 30x1A and 30x1B, respectively, and strobe lines 26x1A and 26x1B are actually output nodes of transistors 28x1A and 28x1, respectively.

P-channel transistors 30x1A and 30x1B each generates a PSA strobe signal at its respective output node in response to an active PLAT signal. The output nodes of transistors 30x1A and 30x1B are electrically isolated from one another. N-channel transistors 28x1A and 28x1B each generates an NSA strobe signal at its respective output node in response to an active NLAT signal. The output nodes of transistors 28x1A and 28x1B are electrically isolated from one another. This arrangement disassociates a potential disturbance on one of the output nodes of one of the P-channel transistors 30x1A and 30x1B from the remaining output node when P-channel transistors 30x1A and 30x1B are not activated and disassociates a potential disturbance on one of the output nodes of one of the N-channel transistors 28x1A and 28x1B from the remaining output node when transistors 28x1A and 28x1B are not activated. As a result the data stored in the array coupled to the remaining output node is not disturbed and remains in a valid state when the sense amps are strobed to refresh the data to selected cells, in the untransferred array sections.

Coupling transistors 22x1A, when active, couple the SAM 18x1 to the digit lines which are coupled to PSAs and NSAs 13x1A and 15x1A respectively. Coupling transistors 22x1B, when active, couple the SAM 18x1 to the digit lines which are coupled to PSAs and NSAs 13x1B and 15x1B respectively.

Operation of the Embodiment

The operation of the invention is best understood with reference to all previous figures. One skilled in the art will easily be able to understand the operation of the invention. Again it is noted, since each array 12x1 through 12x4 are identical, only the first array 12x1 and related circuitry will be discussed to illustrate the operation of the invention.

Figure 2:
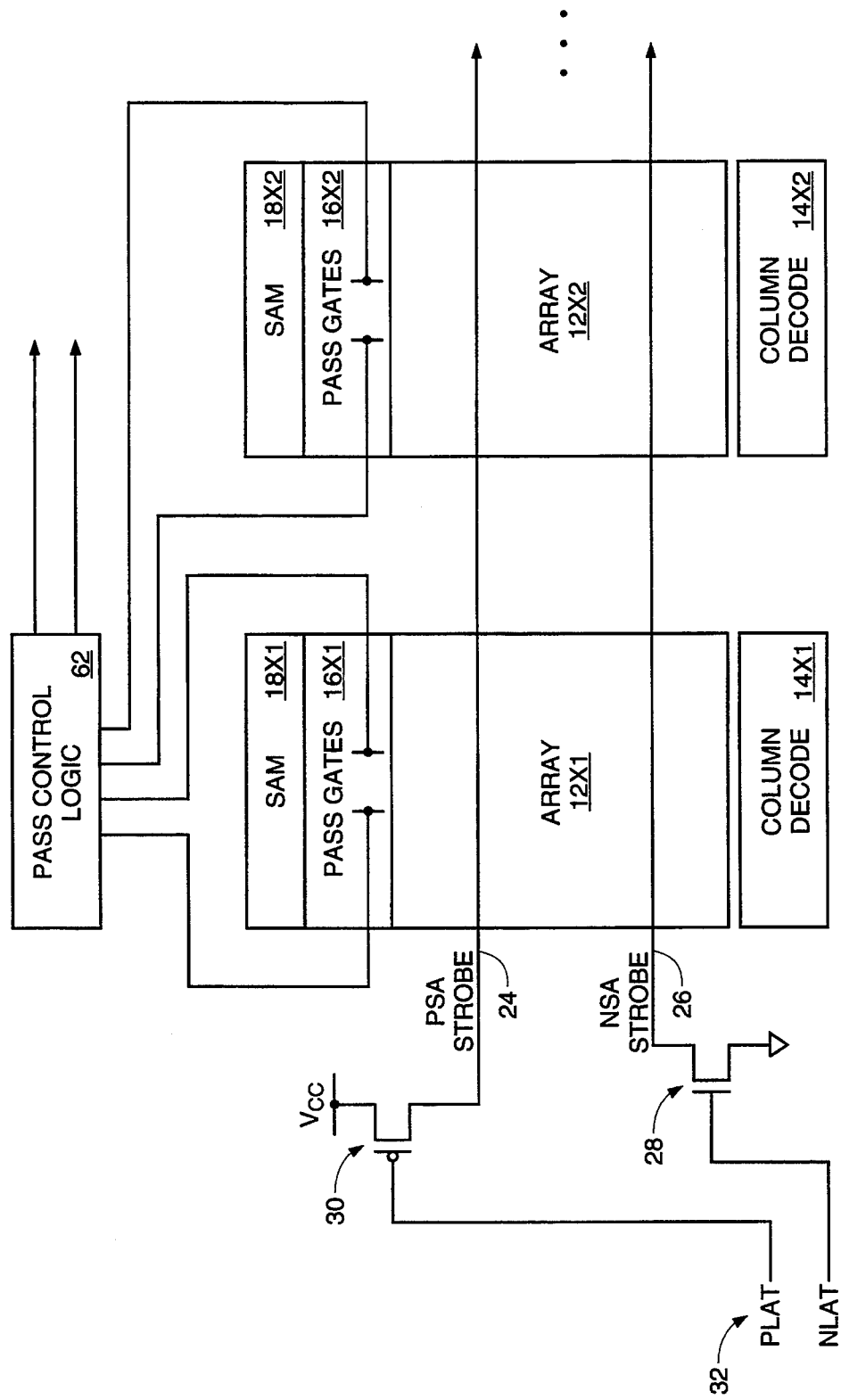
FIG. 2 is a general overall view of related art architecture.

In the operation, it is pointed out the main feature of the invention originates from the modified circuitry connecting NLAT 34 and PLAT 32 signals to the respective sense amps. Specifically, in comparison to the related art of FIG. 2, it is observed that the NSA 12x1 is now divided into a left 12x1a and right 12x1b half, as well as the related circuitry. The benefit of the arrangement is that there is now no possible connection for any SAM to auto latch other array halves via the previous arrangement of NLAT and PLAT strobe lines that interconnected all arrays. Uniquely, NLAT signal 34 is coupled to these separate halves via N-channel transistors 28x1a and 28x1b. Likewise, PLAT signal 32 is coupled to these separate halves via P-channel transistors 30x1a and 30x1b.

For example, if a new pixel is to be written to array half 12x1a, the respective SAM will appropriately lower and raise the voltage on the associated column lines, via transfer gates and pass control circuit 62, whereby the PSA and NSA circuits will auto-latch only those columns in that half of array 12x1a, the row of the pixel location to be written to is taken high. It is noted that the same row in all arrays is pulled high; but, only the arrays being overwritten by the SAM's will be changed. Simultaneously, all other nonwritten arrays are refreshed to maintain data integrity. Advantageously, all nonwritten array halves are unaffected by the write operation of the now isolated array half 12x1a, since PLAT and NLAT strobe lines 24x1a and 26x1a no longer connect to any other array halves of the VRAM.

Remarks about the Invention

It is noted that one skilled in the art will understand that the above described NLAT and PLAT circuitry provides the VRAM with the capability of exclusively and independently write and read pixel information to and from either half of each array without automatically latching the entire array of digit and digit* lines (or both column lines) since there is no longer a continuous connection to all PSA and NSA circuits for each array of the VRAM. Specifically, when a particular pixel or memory cell has to modify or update, the associated SAM will be activated and will affect only the column lines on that associated half of the array.

Variations in the Invention

There are several obvious variations to the broad invention and thus come within the scope of the present invention. Uniquely, although the invention describes only four arrays, this invention may work with any number of arrays in a VRAM, DRAM, or any other device, including nanotechnology, using a plurality of arrays that need to be independently controlled.

Split write transfer functions are likely to use this isolation technique. Just as all types of masked function's are likely to want to use this idea, for example masked flash write.

Additionally, any architecture for the array and related circuitry will work with the invention. Specifically, PSA and NSA can be placed in any number of locations in the VRAM arrays, as can the SAM circuitry.

While the invention has been taught with specific reference to these embodiments, someone skilled in the art will recognize that changes can be made in form and detail without departing from the spirit and the scope of the invention. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

Although subheadings in the Detailed Description of the Illustrated Embodiment are used, these are merely provided for assisting the reader; wherein, the writer is free to enter any information under any heading/s.

What is claimed and desired to be secured by United States Patent is:

1. A video random access memory circuit, comprising:
   a first memory half and a second memory array half;
   a first N latch strobe line electrically associated with the first array half and electrically isolated from the second array half;
   a first P latch strobe line electrically associated with the first array half and electrically isolated from the second array half;
   a first N-sense amplifier circuit electrically associated with the first array half and electrically isolated from the second array half, a first N type enable signal on said first N latch strobe line controlling an activation of said first N-sense amplifier circuit;
   a first P-sense amplifier circuit electrically associated with the first array half and electrically isolated from the second array half, a first P type enable signal on said P latch strobe line controlling an activation of said first P-sense amplifier circuit;
   a second N latch strobe line electrically associated with the second array half and electrically isolated from the first array half;
   a second P latch strobe line electrically associated with the second array half and electrically isolated from the first array half;
   a second N-sense amplifier circuit, electrically associated with the second array half and electrically isolated from the first array half, a second N type enable signal on said second N latch strobe line controlling an activation of said second N-sense amplifier circuit; and
   a second P-sense amplifier circuit electrically associated with the second array half and electrically isolated from the first array half, a second P type enable signal on said second P latch strobe line controlling an activation of said second P-sense amplifier circuit.

2. A video random access memory circuit for storing information, comprising:
   first column lines;
   second column lines;
   first memory cells, each of said first memory cells coupled to one of said first column lines;
   second memory cells, each of said second memory cells coupled to one of said second column lines;
   a first N-sense amplifier circuit coupled to the first column lines without being coupled to the second column lines;
   a first N latch strobe line electrically coupled to the first N-sense amplifier circuit, an enable signal on said first N latch strobe line enabling said fist N-sense amplifier circuit;
   a second N-sense amplifier circuit coupled to the second column lines without being coupled to the first column lines:
   a second N latch strobe line electrically coupled to the second N-sense amplifier circuit, an enable signal on said second N latch strobe line enabling said second N-sense amplifier circuit;
   a first P-sense amplifier circuit coupled to the first column lines without being coupled to the second column lines;
   a first P latch strobe line electrically coupled to the first P-sense amplifier circuit, an enable signal on said first P latch strobe line enabling said first P-sense amplifier circuit;
   a second P-sense amplifier circuit coupled to the second column lines without being coupled to the first column lines;
   a second P latch strobe line electrically coupled to the second P-sense amplifier circuit, an enable signal on said second P latch strobe line enabling said second P-sense amplifier circuit, wherein each of said first and said second N latch strobe lines and each of said first and said second P latch strobe lines are electrically isolated from one another; and wherein
   the information is written to the first memory cells without electrically affecting the information in the second memory cells when said first P-sense amplifier and said first N-sense amplifier are enabled by the enable signals on the first P latch strobe line and the first N latch strobe line; and wherein
   the information is written to the second memory cells without electrically affecting the information in the first memory cells when said second P-sense amplifier and said second N-sense amplifier are enabled by the enable signals on the second P latch strobe line and the second N latch strobe line.

3. A method for performing a mask write transfer in a multi-port memory system, the multiport system having at least one dynamic memory array and at least one serial memory, the dynamic memory array comprised of a first portion and a second portion, the first portion and the second portion having memory cells for storing dynamic data and having digit lines, each of the memory cells coupled to one of the digit lines, the method comprising the following steps:
  a) disabling equilibration of the digit lines in the first and the second portions:
  b) coupling the serial memory to the digit lines in the first portion;
  c) isolating the serial memory from the digit lines in the second portion;
  d) soft latching data from the serial memory to the digit lines in the first portion with a disabled sense amplifier circuit in the first portion;
  e) disassociating a sense amplifier circuit in the second portion from the sense amplifier circuit in the first portion during said step of soft latching to retain valid data in the memory cells in the second portion;
  f) enabling a rowline;
  g) decoupling the serial memory from the digit lines the first portion;
  h) enabling the sense amplifier circuit in the first portion;
  i) latching to the digit lines in the first portion the data from the serial memory;
  j) writing from the digit lines to a selected memory cell the data from the serial memory;
  k) enabling the sense amplifier circuit in the second portion;
  l) latching data originally stored in the memory cells in the second portion to the digit lines in the second portion; and
  m) retaining valid data in the memory cells in said second portion.

4. A memory device, comprising:
  a) a dynamic memory array for storing dynamic data, said dynamic memory array having a first memory array portion and a second memory array portion;
  b) a serial memory for storing serial data capable of transfer to said dynamic memory array for storage therein;
  c) a first coupling circuit for coupling said first memory array portion and said serial memory to one another;
  d) a second coupling circuit for coupling said second memory array portion and said serial memory to one another;
  e) a first sensing circuit in said first memory array portion for sensing data stored and written in said first memory array portion, said first sensing circuit having a first P-sense amplifier and a first N-sense amplifier;
  f) a second sensing circuit in said second memory array portion for sensing data stored and written in said second memory array portion, said second sensing circuit having a second P-sense amplifier and a second N-sense amplifier;
  g) a first switching circuit comprising a first P-channel device in electrical communication with said first P-sense amplifier and comprising a first N-channel device in electrical communication with said first N-sense amplifier, an output of said first switching circuit in electrical communication with said first sensing circuit, said first sensing circuit responding to an output signal of said first switching circuit to sense the data stored and written in said first memory array portion; and
  h) a second switching circuit comprising a second P-channel device in electrical communication with said second P-sense amplifier and comprising a second N-channel device in electrical communication with said second N-sense amplifier, an output of said second switching circuit in electrical communication with said second sensing circuit, said second sensing circuit responding to an output signal of said second switching circuit to sense the data stored and written in said second memory array portion, said outputs of said first and said second switching circuits isolated from one another in order to isolate a voltage disturbance on the output of one of said first and said second switching circuits from the other of said first and said second switching circuits during a deactivation of said first and said second switching circuits;
  i) an N latch node connected to a control input of said first N-channel device and a control input of said second N-channel device, said N latch node accepting an N latch signal to control an activation said first and second N-channel devices to determine when the data in said first and said second memory array portions can be sensed: and
  j) a P latch node connected to a control input of said first P-channel device and a control input of said second P-channel device, said P latch node accepting a P latch signal to control an activation of said first and said second P-channel devices to determine when the data in said first and said second memory array portions can be sensed.

5. A video random access memory device, comprising:
  a) a dynamic memory array for storing dynamic data, said dynamic memory array having a first memory array portion and a second memory array portion;
  b) a serial memory in electrical communication with said dynamic array, said serial memory for storing serial data, said serial data capable of transfer to said dynamic memory array for storage therein;
  c) a first sensing means in electrical communication with said first memory array portion and said serial memory array, said first sensing means for sensing data stored and written in said first memory array portion;
  d) a second sensing means in electrical communication with said second memory array portion and said serial memory array, said second sensing means for sensing data stored and written in said second memory array portion;
  e) a first switching means, an output of said first switching means in electrical communication with said first sensing means, said first sensing means responding to an output signal of said first switching means to sense the data stored and written in said first memory array portion;
  f) a second switching means, an output of said second switching means in electrical communication with said second sensing means, said second sensing means responding to an output signal of said second switching means to sense the data stored and written in said second memory array portion, said outputs of said first and said second switching means isolated from one another.

6. A multi-port memory device, comprising:
  a) a plurality of dynamic memory arrays for storing dynamic data, each one of said dynamic memory arrays having a first memory array portion and a second memory array portion;
  b) a plurality of serial memories, each one of said serial memories in electrical communication with one of said dynamic memory arrays, said serial memories for storing serial data, said serial data capable of transfer to one of said dynamic memory arrays from a corresponding one of said serial memories for storage therein;

c) a plurality of first sensing means, each one of said first sensing means in electrical communication with one of said first memory array portions and a corresponding one of said serial memories, each of said first sensing means for sensing data stored and written in a corresponding one of said first memory array portions;

d) a plurality of second sensing means, each one of said second sensing means in electrical communication with one of said second memory array portions and a corresponding one of said serial memories, each of said second sensing means for sensing data stored and written in a corresponding one of said second memory array portions;

e) a plurality of first switching means, an output of each one of said first switching means in electrical communication with a corresponding one of said first sensing means, each of said first sensing means responding to an output signal of the corresponding said first switching means to sense the data stored and written in a corresponding one of said first memory array portions, said outputs of said first switching means isolated from one another; and f) a plurality of second switching means, an output of each one of said second switching means in electrical communication with a corresponding one of said second sensing means, each of said second sensing means responding to an output signal of the corresponding said second switching means to sense the data stored and written in a corresponding one of said second memory array portions, said outputs of said second switching means isolated from one another, wherein said output of said first and said second switching means are isolated from one another.

7. A multi-port memory device, comprising:

a) a plurality of dynamic memory arrays for storing dynamic data;

b) a plurality of serial memories, each one of said serial memories in electrical communication with a corresponding one of said dynamic memory arrays, said serial memories for storing serial data, said serial data capable of transfer from one of said serial memories to said corresponding one of said dynamic memory arrays for storage therein;

c) a plurality of first sensing means, each one of said first sensing means in electrical communication with one of said serial memories and one of said dynamic memory arrays, each of said first sensing means for sensing data stored and written in said dynamic memory array in electrical communication therewith;

d) a plurality of second sensing means, each one of said second sensing means in electrical communication with one of said serial memories and one of said dynamic memory arrays, each of said second sensing means for sensing data stored and written in said dynamic memory array in electrical communication therewith;

e) a plurality of first switching means, an output node of each one of said first switching means in electrical communication with a corresponding one of said first sensing means, each of said first sensing means responding to an output signal of the corresponding said first switching means to sense the data stored and written in one of said dynamic memory arrays, said output nodes of said first switching means isolated from one another; and f) a plurality of second switching means, an output node of each one of said second switching means in electrical communication with a corresponding one of said second sensing means, each of said second sensing means responding to an output signal of the corresponding said second switching means to sense the data stored and written in one of said dynamic memory memory arrays, said output nodes of said second switching means isolated from one another, wherein said output nodes of said first and said second switching means are isolated from one another.

* * * * *